(12) United States Patent
Mayuzumi et al.

(10) Patent No.: US 8,618,881 B2
(45) Date of Patent: Dec. 31, 2013

(54) CLASS-D POWER AMPLIFIER

(75) Inventors: Toshiro Mayuzumi, Hamamatsu (JP); Takeshi Togawa, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 72 days.

(21) Appl. No.: 13/050,866

(22) Filed: Mar. 17, 2011

(65) Prior Publication Data

US 2011/0227645 A1    Sep. 22, 2011

(30) Foreign Application Priority Data

Mar. 18, 2010  (JP) ................................. 2010-062601

(51) Int. Cl.
   *H03F 3/217*    (2006.01)

(52) U.S. Cl.
   USPC ........................................ 330/251; 330/207 A

(58) Field of Classification Search
   USPC ........................................ 330/251, 207 A, 10
   See application file for complete search history.

(56) References Cited

U.S. PATENT DOCUMENTS

| | | | | |
|---|---|---|---|---|
| 5,225,789 | A | * | 7/1993 | Caine et al. ...................... 330/10 |
| 6,118,336 | A | * | 9/2000 | Pullen et al. ..................... 330/10 |
| 6,297,693 | B1 | * | 10/2001 | Pullen .............................. 330/10 |
| 6,300,825 | B1 | * | 10/2001 | Dijkmans et al. ................ 330/10 |
| 7,113,038 | B2 |  | 9/2006 | Putzeys |
| 7,279,967 | B2 | * | 10/2007 | Quilter ............................. 330/10 |
| 7,282,992 | B2 | * | 10/2007 | Barkaro et al. ................ 330/251 |
| 8,022,756 | B2 | * | 9/2011 | Walker et al. .................... 330/10 |
| 2010/0182083 | A1 | * | 7/2010 | Maeda ........................... 330/251 |

FOREIGN PATENT DOCUMENTS

| | | |
|---|---|---|
| CN | 101018041 A | 8/2007 |
| JP | 61-021007 B | 5/1986 |
| JP | 04-159803 A | 6/1992 |
| JP | 2001-148636 A | 5/2001 |
| JP | 2006-060580 A | 3/2006 |

OTHER PUBLICATIONS

Chinese Office Action mailed Mar. 28, 2013, for Chinese Patent Application No. 20110070434, 10 pages.
Notification of Reasons for Refusal mailed Aug. 19, 2013, for JP Application No. 2010-062601, five pages.

* cited by examiner

*Primary Examiner* — Henry Choe
(74) *Attorney, Agent, or Firm* — Morrison & Foerster LLP

(57) ABSTRACT

A class-D power amplifier includes a switching power source section, a synchronization signal generation section and a class-D power amplifying section. The synchronization signal generation section takes out of the switching power source section a clock signal having a second frequency which is "n" times of a first frequency. The class-D power amplifying section includes a comparator which compares an input signal with a feedback signal, a second switching section which switches a power source fed from the synchronization signal generation section, a filter section which smoothes an output signal from the second switching section, and a combining section which combines a delayed output signal with a clock signal from the synchronization signal generation section to generate the feedback signal. The class-D power amplifying section is adjusted so as to cause self-oscillating operation at a frequency substantially identical with the second frequency, when a level of the output signal from the filter section is low.

11 Claims, 2 Drawing Sheets

OVERALL CONFIGURATION
OF CLASS-D AMPLIFIER

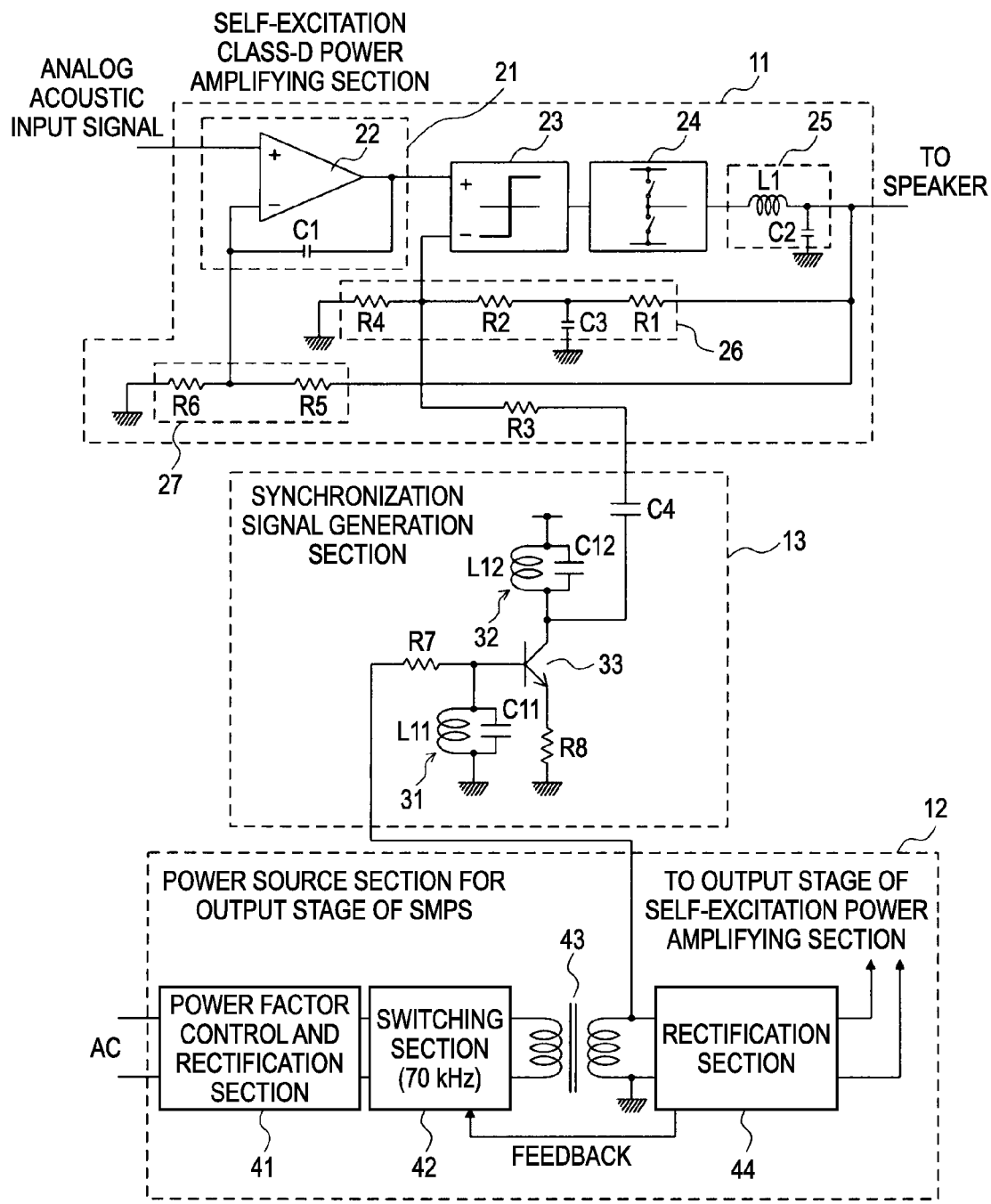

CLASS-D POWER AMPLIFIER

BACKGROUND

The present invention relates to a class-D power amplifier and, more particularly, to a class-D power amplifier that enables reduction of beat noise and that is suitable for amplifying power of an audio signal.

A hitherto known self-excitation class-D amplifier includes an integrating circuit, a comparator which receives an output from the integrating circuit as an input; a switching circuit which is activated by an output from the comparator; and a low-pass filter connected to an output side of the switching circuit. A feedback is applied from an output terminal of the low-pass filter to the comparator by way of a first feedback circuit. Another feedback is applied from the output terminal of the low-pass filter to an input terminal of the integrating circuit by way of a second feedback circuit (see JP-B-61-21007).

A class-D power amplifier using a switching power source is described in JP-A-2006-60580. When power is fed to a class-D amplifying circuit by the switching power source, a difference between a switching frequency f1 of the class-D amplifying circuit and a switching frequency f2 of the switching power source; namely, $\Delta f = abs(f1-f2)$, causes beat noise, which in turn deteriorates sound quality. In light of this, the switching frequency of the class-D amplifying circuit and the switching frequency of the switching power source are synchronized to each other, thereby reducing the beat noise.

A pulse modulator 120 of a class-D amplifier (a digital amplifying module 100) described in JP-A-2006-60580 includes a logic circuit (a D flip flop 174) that is provided in a PWM loop circuit and that is synchronized with a clock signal (FIG. 3 of JP-A-2006-60580). In the configuration, since the D flip flop 174 is inserted into an arbitrary point in the loop circuit, the class-D amplifier cannot perform operation out of synchronization with an input synchronization clock signal.

In the hitherto self-excitation class-D amplifier described in JP-B-61-21007, when an output level of the amplifier becomes greater, a frequency of self excitation generally decreases, whereby a total harmonic distortion (THD) of the output is reduced. Meanwhile, according to the technique described in JP-A-2006-60580, the amplifier cannot perform operation out of synchronization with an external clock signal. Hence, when a large output is produced, an amount of negative feedback from the output terminal to the input terminal is decreased, and THD becomes worse.

Moreover, there is a necessity for feeding a stable clock signal to the D flip flop 174 described in JP-A-2006-60580. For this reason, a PLL circuit 176 is adopted as a synchronization clock signal generator. However, the PLL circuit has a complicate configuration and suffers an inconvenience of an increase in an entire scale of circuitry.

SUMMARY

The purpose of the present invention is to reduce beat noise in a class-D power amplifier using a switching power source without involvement of an increase in circuit scale and to prevent deterioration of THD, which would otherwise be caused when an output level is high.

In order to accomplish the objective, a class-D power amplifier of the present invention comprising:

a switching power source section that includes:

a first switching section which switches a DC power source output having a predetermined voltage at a first frequency;

a transformer section which inputs an output from the first switching section to a primary coil thereof and takes out a converted output from a secondary coil thereof;

a rectification section which rectifies the converted output taken out of the secondary coil of the transformer section; and a feedback section which controls switching of the first switching section by applying a feedback to the first switching section from the rectification section to maintain a voltage of the converted output from the rectification section constant;

a synchronization signal generation section that includes a filter circuit which takes out of the switching power source section a clock signal having a second frequency which is "n" times of the first frequency, wherein "n" is an integer of two or more; and a class-D power amplifying section that includes:

a comparator which compares an input signal with a feedback signal;

a second switching section which switches a power source fed from the rectification section according to an output from the comparator;

a filter section which smoothes an output from the second switching section to form an output signal; and a combining section which delays a phase of the output signal from the filter section and which combines the delayed output signal with a clock signal from the synchronization signal generation section to generate the feedback signal, wherein the class-D power amplifying section is tuned so as to cause self-oscillating operation at a frequency which is substantially identical with the second frequency, where a level of the output signal from the filter section is lower than that of the clock signal from the synchronization signal generation section.

Preferably, the filter circuit of the synchronization signal generation section is a bandpass filter which has a frequency passing band having a predetermined frequency width including the second frequency. The synchronization signal generation section can take out the clock signal having the second frequency by using the bandpass filter.

According to the present invention, when the output level of the output signal from the filter section is higher than that of the clock signal from the synchronization signal generation section, the original operation of the self-excitation class-D amplifier that is out of synchronization with a clock signal synchronized with the switching power source is performed, thereby preventing deterioration of THD, which would otherwise be caused at the time of a high output. When the output level of the output signal from the filter section is lower than that of the clock signal from the synchronization signal generation section, the class-D power amplifying section performs operation (externally-oscillating operation) synchronous with the clock signal synchronized with the switching power source, whereby occurrence of audible beat noise can be prevented. Since a person is conscious of the beat noise when the output of the speaker is low, the capability of preventing occurrence of beat noise at a low level of the output from the speaker is very advantageous. Moreover, according to the present invention, use of a logic circuit having a high analogous quality (e.g., the D flip flop 174 described in connection with JP-A-2006-60580) is obviated, nor is used a PLL circuit that serves as a synchronization clock signal generator. The entire circuit scale of an amplifier becomes smaller.

BRIEF DESCRIPTION OF THE DRAWINGS

The above objects and advantages of the present invention will become more apparent by describing in detail preferred exemplary embodiments thereof with reference to the accompanying drawings, wherein:

FIG. 2 is a detailed block diagram of the amplifier shown in FIG. 1.

DETAILED DESCRIPTION OF EXEMPLARY EMBODIMENTS

Figure 1:
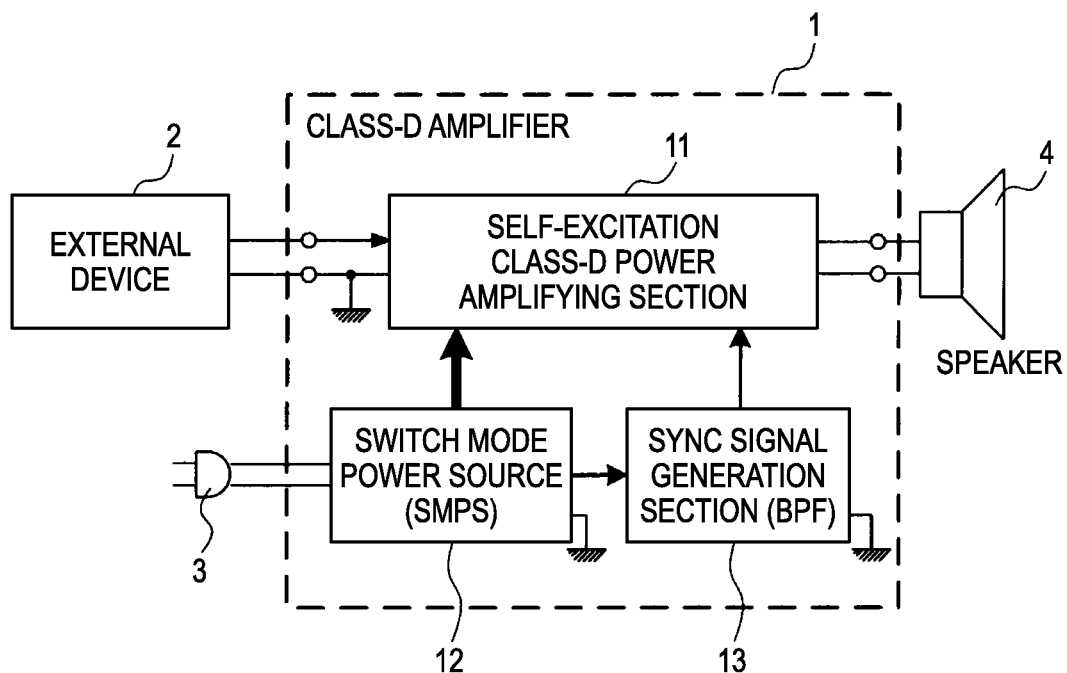
FIG. 1 is a block diagram showing an overview of an overall structure of a self-excitation class-D amplifier of the present invention.

An embodiment of the present invention is hereunder described by reference to the drawings.

FIG. 1 shows an overall structure of a self-excitation class-D amplifier of the present invention. A class-D amplifier 1 includes a self-excitation class-D power amplifying section 11, a switch mode power source (a switching power source) 12, and a synchronization signal generation section 13. An external device 2 is a source for feeding an analog acoustic signal (an input signal). The self-excitation class-D power amplifying section 11 is a highly efficient power amplifying section that subjects the input signal to pulse width modulation (PWM) and amplifies a power of the signal by a switching circuit. An analog acoustic input signal transmitted from the external device 2 is amplified in the power amplifying section and emitted as sound from a speaker 4. The switching mode power source section 12 is a power converter that rectifies an electric power of a commercial power source (AC 100V, or the like) 3 and converts the AC power source into a DC power source for feeding a constant voltage by use of a feedback circuit, a switching element, a transformer, and the like. The converted DC power source feeds electric power to respective sections in the class-D power amplifier 1 including the power amplifying section 11.

FIG. 2 is a block diagram showing a detailed configuration of the class-D amplifier 1 shown in FIG. 1.

The self-excitation class-D power amplifying section 11 is now described. A main point of operation of the self-excitation class-D power amplifying section 11 lies in that an input-stage amplifier (an integrator) 21 and a comparator 23 converts the analog acoustic signal into a pulse width modulated (PWM) signal, a switching circuit 24 is turned on and off by the PWM signal. The amplified PWM signal output from the switching circuit 24 is demodulated by a low-pass filter 25 into an analog acoustic signal. The analog acoustic signal (an output signal) output from the low-pass filter 25 is output to a load, such as a speaker.

The input-stage amplifier 21 includes a differential amplifier 22 and a capacitor C1 arranged between an output terminal and a negative input terminal of the differential amplifier 22. An input signal from the external device 2 is input to a positive input terminal of the differential amplifier 22. The negative input terminal of the differential amplifier 22 is connected to an output terminal of the low-pass filter 25 by way of a second feedback circuit 27.

An input-stage output signal output from the input-stage amplifier 21 is input to a positive input terminal of the comparator 23. A feedback signal taken out of an output from the low-pass filter 25 is input to a negative input terminal of the comparator 23 by way of a first feedback circuit 26. The comparator 23 compares an input-stage output signal from the input-stage amplifier 21 through the positive input terminal of the comparator 23 with a feedback signal input through the negative input terminal of the comparator 23, and generates a pulse width modulated signal (PWM signal) based on a comparison result of the comparator 23. The comparator 23 outputs a high-side pulse (having a positive voltage value) during a period when the input-stage output signal is greater than the feedback signal. Also, the comparator 23 outputs a low-side pulse (having a negative voltage value) during a period when the input-stage output signal is smaller than the feedback signal. A loop circuit including the comparator 23, the switching circuit 24, the low-pass filter 25, and the first feedback path 26 has a sufficient gain and performs self-oscillation at a frequency fo at which a phase lag between an input of the comparator 23 and an output of the first feedback path 26 comes to 180°. In the loop circuit, level information represented by a voltage amplitude of the input signal is converted into time information represented by a pulse width of the PWM signal, whereby a PWM signal commensurate with the input signal is output from the comparator 23 to the switching circuit 24.

The PWM signal output from the comparator 23 is input to the switching circuit 24. The switching circuit 24 on the output stage includes two switching elements having a push pull configuration. The switching circuit 24 is fed a positive source voltage and a negative source voltage from a rectification section 44 of the power source section 12 to be described later. The switching element is generally made up of a transistor or an FET. The switching circuit 24 alternately activates and deactivates the two switching elements at an interval equivalent to a pulse width of the input PWM signal, whereby the switching circuit 24 outputs a power-amplified PWM signal by use of the electric power fed by the power source section 12.

The low-pass filter (an LC filter) 25 including an inductor L1 and a capacitor C2 is connected to a stage subsequent to the switching circuit 24. The power-amplified PWM signal output from the switching circuit 24 is input to the low-pass filter 25. The low-pass filter 25 removes a high frequency component from the power-amplified PWM signal output from the switching circuit 24, thereby demodulating the analog acoustic signal from the PWM signal. When the level of the input signal is zero, a duty ratio of the PWM signal (a ratio of a pulse width to one period) comes to 50%, and the level of an output signal from the low-pass filter 25 is also zero. When the acoustic signal is input to the differential amplifier 22, the pulse width of the PWM signal also changes according to the level of the input acoustic signal. As a consequence, the level of the output signal from the low-pass filter 25 also changes in proportion to the time of the pulse width. The output signal from the low-pass filter 25 will be amplified to a positive domain if the width of the high-side pulse becomes longer with respect to the PWM signal. On the contrary, when the width of the low-side pulse is longer with respect to the one period of the PWM signal, the output signal from the low-pass filter 25 is amplified to a negative domain. The output signal (the analog acoustic signal) from the low-pass filter 25 is output to a load; for instance, a speaker, connected to the output terminal of the low-pass filter 25.

The output signal from the low-pass filter 25 is input to the negative input terminal of the comparator 23 by way of the first feedback circuit 26. The first feedback circuit 26 is configured by a delay circuit including resistors R1, R2, R4 and a capacitor C3. The first feedback circuit 26 acts as a feedback circuit for performing PWM modulation in the comparator 23 in a self-oscillating manner. It is possible to adjust the self-oscillation frequency fo of the PWM signal achieved when the input signal is zero, by changing the phase lag of the first feedback circuit 26.

The output signal from the low-pass filter 25 is input to the negative input terminal of the differential amplifier 22 by way of the second feedback circuit 27. The second feedback circuit 27 has resistors R5 and R6. Specifically, a speaker output signal (the output signal from the low-pass filter 25) and a voltage determined by dividing a ground potential by the resistors R5 and R6 are input to the negative input terminal of the differential amplifier 22. The second feedback circuit 27 determines a gain and a frequency characteristic of the overall class-D amplifier including the feedback circuits 26 and 27 as well as the input-stage amplifier 21. The second feedback circuit 27 acts as a feedback circuit for letting an output voltage output to the speaker 4 become proportional to an input voltage input to the positive input terminal of the differential amplifier 22.

The self-excitation class-D amplifier including the input-stage amplifier 21, the comparator 23, the switching circuit 24, the low-pass filter 25, the first feedback circuit 26, and the second feedback circuit 27 is a known configuration and disclosed in; for instance, JP-B-61-21007.

The self-oscillation frequency of only the self-excitation class-D power amplifying section 11 shown in FIG. 2 (i.e., the self-excitation class-D power amplifying section 11 with no synchronization signal generation section 13) depends on a voltage value of the speaker output signal (an acoustic signal) output from the low-pass filter 25. Specifically, when a duty cycle of the PWM signal output from the switching circuit 24 is changed in accordance with a change in level of the acoustic signal input to the self-excitation class-D power amplifying section 11, the self-oscillation frequency is also changed. Specifically, when the level of the speaker output signal becomes high, the self-oscillation frequency becomes low, whereby total harmonic distortion (THD) of the output can be suppressed. Moreover, if a switching power source is used for the configuration including only the self-excitation class-D power amplifying section 11 shown in FIG. 2 as the power source, beat noise will occur as described in the mentioned related art.

Accordingly, the class-D amplifier 1 of the present embodiment includes the power source section 12 and the synchronization signal generation section 13 as shown in FIG. 2 to resolve the foregoing problem. The configuration is hereunder described.

The switch mode power source section 12 is an external-excitation switching power source and includes a power factor control-and-rectification section 41, a switching section 42, a transformer section 43, and a rectification section 44. The power factor control-and-rectification section 41 rectifies an electric power of an AC. commercial power source and performs power factor control in order to improve a power factor. The switching section 42 converts the DC. power rectified by the power factor control-and-rectification section 41 into high frequency AC power by letting a switching element perform switching operation. The switching section 42 has a built-in oscillator having about 70 kHz frequency. The switching section 42 converts electric power into AC. voltage by performing a switching operation at a frequency of 70 kHz. A primary coil of the transformer section 43 receives a high frequency AC. voltage from the switching section 42 as a primary input, and transmits energy to a secondary coil of the transformer section 43, thereby effecting voltage conversion. An output from the secondary coil of the transformer section 43 is rectified and smoothed by the rectifying section 44 and the thus-rectified, smoothed output is fed to an output stage of the power amplifying section 11. In order to maintain the secondary voltage in constant, the rectification section 44 detects the output voltage and controls switching operation (a duty ratio) by applying a feedback to the switching section 42 in such a way that the output voltage becomes constant. An electronic power is fed to sections other than the output stage of the power amplifying section 11 from another unillustrated power source section (a power source section for a preceding stage of the power amplifying section 11).

The synchronization signal generation section 13 includes an LC circuit 31 having an inductor L11 and a capacitor C11; an LC circuit 32 having an inductor L12 and a capacitor C12; an amplifying transistor 33, resistors R7 and R8, and a capacitor C4. A resonance frequency of the LC circuit 31 is set to 340 kHz, and a resonance frequency of the LC circuit 32 is set to 360 kHz. The synchronization signal generation section 13 thereby acts as a bandpass filter (BPF) that exhibits peaks at 340 kHz and 360 kHz, respectively, and that takes a frequency 350 kHz between the peaks as a center. Accordingly, a 350 kHz clock signal synchronous with switching operation of the power source section 12 is obtained from the AC power source switched by the power source section 12 at 70 kHz. The 350 kHz clock signal is input to a feedback point (i.e., the negative input terminal of the comparator 23) of the first feedback circuit 26 of the power amplifying section 11 from the synchronization signal generation section 13 by way of the coupling capacitor C4 and the resistor R3.

(1) When the level of the output signal is low, the 350 kHz clock signal output from the synchronization signal generation section 13 shows relatively stronger action than the signal fed back from the low-pass filter 25 by way of the first feedback circuit 26, and hence the power amplifying section 11 performs self-oscillating operation synchronization with the clock signal (i.e., externally-oscillating-like operation). (2) When the level of the output signal is high, the signal fed back from the low-pass filter 25 by way of the first feedback circuit 26 shows relatively stronger action than the 350 kHz clock signal output from the synchronization signal generation section 13. As a result, the power amplifying section 11 is released from the synchronous state caused by the clock signal, thereby performing unique oscillation (self-exciting operation). Accordingly, in the case (1), there is performed externally-oscillating operation in which the switching frequency of the power amplifying section 11 and the switching frequency of the power source section 12 are synchronized to each other. Hence, occurrence of beat noise can be prevented. In the meantime, in the case (2), an amount of feedback to the first feedback circuit 26 is great, and hence self-exciting operation is performed, so that THD can be suppressed.

The "external-excitation" class-D power amplifier has a triangular wave oscillation circuit for oscillating a triangular wave used in PWM modulation. The class-D power amplifier of the present embodiment is not provided with a triangular wave oscillation circuit, and a basic circuit configuration is of self-oscillation type. In the case (1), the clock signal that is taken out of the switching power source and that is synchronous with switching operation of the switching power source is applied to the feedback signal for the comparator that performs PWM modulation of the self-excitation class-D power amplifier. As a result, when the level of the input signal is low (typically a level of 0; namely, when no input signal exists), self-oscillating operation synchronous with the clock signal is performed, whereby operation like external-oscillating operation is performed. In this sense, an expression "externally-oscillating-like operation" is provided in the case (1).

A circuit configuration of the self-excitation class-D power amplifying section 11 is not limited to the circuit shown in FIG. 2. The present invention can be applied to another self-excitation class-D power amplifier of any circuit configuration, as well.

The switching frequency of the power source section 12 is set to 70 kHz, and the self-oscillation frequency of the class-D power amplifying section 11 is tuned to 350 kHz. However, the present invention is not limited to the combination. An oscillation frequency of the power source and an oscillation frequency of the class-D power amplifying section can be arbitrarily selected during a design phase. Only requirement for selection is that the oscillation frequency of the class-D power amplifying section is an ("n") integral multiple(s) of the oscillation frequency of the power source section. For instance, the oscillation frequency of the power source section can be set to 80 kHz, and the oscillation frequency of the class-D power amplifying section can be set to 480 kHz.

Although a difference between the resonance frequency of the filter 31 and the resonance frequency of the filter 32 is set to 20 kHz, the difference can also be changed, as appropriate, according to a degree of stability of the oscillation frequency of the power source section 12, and the like. For instance, the difference can also be set to 16 kHz or 26 kHz. As a result of a range of choice of this degree being imparted to the difference setting, the level of the clock signal can be prevented from an excess change even when a slight deviation has occurred in the switching frequency of the power source section 12. However, the two resonance frequencies must be set so as to be able to sufficiently damp integral harmonic waves other than the foregoing harmonic wave having the ("n") integral multiples in the signal of the secondary winding of the power source.

Although the self-excitation class-D power amplifying section 1 of the present embodiment has a similar configuration to that shown in FIG. 4 of JP-B-61-21007. However, the present invention can also be applied to a power amplifier having a self-excitation class-D power amplifying section having a configuration other than the configuration mentioned above. For instance, even in the case of the configuration shown in FIGS. 1 and 6 of JP-B-61-21007 and the configuration disclosed in U.S. Pat. No. 7,113,038, a clock signal from the synchronization signal generation section 13 is added to the feedback signal for self-oscillating operation of each of the configurations, as necessary, whereby operation analogous to that described in the present invention can be performed.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2010-062601 filed on Mar. 18, 2010, the contents of which are incorporated herein by reference.

What is claimed is:

1. A class-D power amplifier comprising:
   a switching power source section that includes:
      a first switching section which switches a DC power source output having a predetermined voltage at a first frequency;
      a transformer section which inputs an output from the first switching section to a primary coil thereof and takes out a converted output from a secondary coil thereof;
      a rectification section which rectifies the converted output taken out of the secondary coil of the transformer section; and
      a feedback section which controls switching of the first switching section by applying a feedback to the first switching section from the rectification section to maintain a voltage of the converted output from the rectification section constant;
   a synchronization signal generation section that includes a filter circuit which takes out of the switching power source section a clock signal having a second frequency which is "n" times of the first frequency, wherein "n" is an integer of two or more; and
   a class-D power amplifying section that includes:
      a comparator which compares an input signal with a feedback signal;
      a second switching section which switches a power source fed from the rectification section according to an output from the comparator;
      a filter section which smoothes an output from the second switching section to form an output signal; and
      a combining section which delays a phase of the output signal from the filter section and which combines the delayed output signal with a clock signal from the synchronization signal generation section to generate the feedback signal,
   wherein the class-D power amplifying section is tuned so as to cause self-oscillating operation at a frequency which is substantially identical with the second frequency, where a level of the output signal from the filter section is lower than that of the clock signal from the synchronization signal generation section.

2. The class-D power amplifier according to claim 1, wherein the filter circuit of the synchronization signal generation section is a bandpass filter which has a frequency passing band having a predetermined frequency width including the second frequency.

3. The class-D power amplifier according to claim 2, wherein the bandpass filter is configured by a first LC circuit and a second LC circuit; and
   wherein a resonance frequency of the first LC circuit is different from that of the second LC circuit.

4. An amplifier circuit, comprising:
   a class-D power amplifier having a self-oscillating circuit;
   a switching power source configured for providing power to the class-D power amplifier, the power source switching at a first frequency; and
   a synchronization signal generator configured for providing a synchronization signal to the class-D power amplifier, the synchronization signal having a second frequency related to the first frequency,
   wherein the class-D power amplifier is configured to switch between a self-oscillating mode and a synchronized mode using the synchronization signal and based on an output level of the class-D power amplifier;
   wherein the self-oscillating circuit comprises a feedback loop, and wherein the synchronization signal generator is connected to the feedback loop.

5. The amplifier circuit according to claim 4, wherein the feedback loop comprises a delay section connected to a comparator, and wherein the synchronization signal is provided to the feedback loop.

6. The amplifier circuit according to claim 4, wherein the second frequency is an integer multiple of the first frequency.

7. An amplifier circuit, comprising:
   a class-D power amplifier having a self-oscillating circuit;

a switching power source configured for providing power to the class-D power amplifier, the power source switching at a first frequency; and a synchronization signal generator configured for providing a synchronization signal to the class-D power amplifier, the synchronization signal having a second frequency related to the first frequency, wherein the class-D power amplifier is configured to switch between a self- oscillating mode and a synchronized mode using the synchronization signal and based on an output level of the class-D power amplifier;

wherein the synchronization signal generator comprises a filter circuit, and wherein the synchronization signal is derived from the switching power source through the filter circuit.

8. A method comprising:

providing power from a switching power source to a class-D power amplifier having a self-oscillating circuit, the power source switching at a first frequency;

providing a synchronization signal to the class-D power amplifier, the synchronization signal having a second frequency related to the first frequency; and switching the class-D power amplifier between a self-oscillating mode and a synchronized mode using the synchronization signal and based on an output level of the class-D power amplifier; p1 wherein the self-oscillating circuit comprises a feedback loop, and wherein the synchronization signal is provided to the feedback loop.

9. The method of claim 8, wherein the feedback loop comprises a delay section connected to a comparator, and wherein the synchronization signal is provided to the feedback loop.

10. The method of claim 8, wherein the second frequency is an integer multiple of the first frequency.

11. The method of claim 8, wherein the synchronization signal is derived from the switching power source through a filter circuit.

* * * * *